US008530143B2

(12) United States Patent
Levanon et al.

(10) Patent No.: US 8,530,143 B2
(45) Date of Patent: Sep. 10, 2013

(54) SILICATE-FREE DEVELOPER COMPOSITIONS

(75) Inventors: Moshe Levanon, Ness-Ziona (IL); Leonid Askadsky, Bat-Yam (IL)

(73) Assignee: Eastman Kodak Company, Rochester, NY (US)

( * ) Notice: Subject to any disclaimer, the term of this patent is extended or adjusted under 35 U.S.C. 154(b) by 50 days.

(21) Appl. No.: 12/948,814

(22) Filed: Nov. 18, 2010

(65) Prior Publication Data
US 2012/0129095 A1    May 24, 2012

(51) Int. Cl.
*G03F 7/00* (2006.01)
*G03F 7/32* (2006.01)
*B41N 1/08* (2006.01)
*B41M 5/00* (2006.01)

(52) U.S. Cl.
USPC ........... 430/302; 430/406; 430/434; 101/453; 101/463.1

(58) Field of Classification Search
None
See application file for complete search history.

(56) References Cited

U.S. PATENT DOCUMENTS

| 3,672,821 | A | 6/1972 | Schlussler | |
|---|---|---|---|---|
| 6,803,167 | B2 * | 10/2004 | Patel et al. | 430/166 |
| 7,399,576 | B1 | 7/2008 | Levanon | |
| 7,544,462 | B2 | 6/2009 | Levanon et al. | |
| 2002/0015911 | A1 * | 2/2002 | Nakamura | 430/270.1 |
| 2005/0042546 | A1 * | 2/2005 | Ozaki et al. | 430/302 |
| 2005/0130082 | A1 * | 6/2005 | Kanda et al. | 430/464 |
| 2006/0154187 | A1 | 7/2006 | Wilson et al. | |
| 2009/0162783 | A1 * | 6/2009 | Levanon et al. | 430/281.1 |

FOREIGN PATENT DOCUMENTS

| CA | 1097491 | 3/1981 |
|---|---|---|
| JP | 57053749 | 3/1982 |
| JP | 08-234448 | 9/1996 |
| JP | 2003-029426 | 1/2003 |

OTHER PUBLICATIONS

Ukrainskii Khimicheskii Zhurnal (Russian Ed vol. 488 (1982).
Corrosion of Duraluminium in Acid and Alkaline Solutions, by I.A. Ammar, et al. vol. 9, (1962).
Metallic Corrosion Inhibitors, by I.N. Putilova et al, (1960) Chapter 4.
Influence of Some Cation-Citrate Combinations on the Corrosion & Anodic Behaviour of Aluminium in Sodium Hydroxide Solution, by S. Venkitakrishna Iyer et al, Indian J.of Tech, vol. 10, Feb. 1972, pp. 65-66.
Inhibition Effect of Calcium Tartrate on the Corrosion of Pure Aluminum in an Alkaline Solution, by H.B. Shao et al, Corrosion—vol. 57, No. 1 (2001).
The cooperative effect of calcium ions and tartrate ions on the corrosion inhibition o pure aluminum in an alkaline solution, by H.B. Shao et al, Mat. Chem & Physics, 77 (2002) 305-309.
Corrosion Inhibition of an Aluminium-Silicon-Magnesium Alloy in Alkaline Media, by G. Daufin et al, Corrosion Sci, 1977, vol. 17, pp. 901-912.
Mechanisms of corrosion inhibition for an aluminium-silicon-magnesium alloy in 0.1 N NaOH solutions at 60° C., by E. Triki et al, Werkstoffe and Korrosion 30, 259-265 (1979(.
Study of an Inhibiting Aluminosilicate Interface by Infrared Reflection Spectroscopy, by J.P. Labbe, Electronics and Optics, *Thin Solid Films*, 82, (1981) 113-119.
Synthetic chelating agents and compounds exhibiting complexing properties in the aquatic environment, by Thomas P. Knepper, Trends in Analytical Chemistry, vol. 22, No. 10 (2003).
Study on the Entry of Synthetic Chelating Agents and Compounds Exhibiting Complexing Properties into the Aquatic Environment, by Thomas P. Knepper et al, Vom Wasser, 97, 193-232 (2001).
Aluminum: A Neurotoxic Product of Acid Rain, by R.Bruce Martin, *Acc. Chem. Res.* (1994) 27, pp. 204-210.
Effect of Ethylene Diaminetetraacetic Acid on the Corrosion of Aluminum in Chloride Solutions, by S. Zor et al, *Mat Sci*,vol. 44, No. 6 (2008).
The aluminum chemistry and corrosion in alkaline solution, by Jinsuo Zhang et al, J. of Nuclear Materials, 384 (2009) 175-189.
Phosphonopolycarboxylates as Chemical Assitives for Calcite Scale Dissolution and Metallic Corrosion Inhibition Based on a Calcium-Phosphonotricarboxylate Organic-Inorganic Hybrid, by Konstantinos D. Demadis et al, (2006) Am Chem Soc.
Effects of Structural Differences on Metallic Corrosion Inhibition by Metal-Polysphosphonate Thin Films by Konstantinos D. Demadis et al, *Ind. Eng,. Chem. Res.* 2006, 45, 7795-7800.
U.S. Appl. No. 12/948,812, filed Nov. 18, 2010, titled "Silicate-Free Developer Compositions" by Levanon et al.
U.S. Appl. No. 12/948,808, filed Nov. 18, 2010, titled "Methods of Processing Using Silicate-Free Developer Compositions" by Levanon et al.

* cited by examiner

*Primary Examiner* — Cynthia H Kelly
*Assistant Examiner* — Alyssa L Cepluch
(74) *Attorney, Agent, or Firm* — J. Lanny Tucker

(57) ABSTRACT

A silicate-free alkaline aqueous developer composition has a pH of at least 12 and comprises a metal cation $M^{2+}$ selected from barium, calcium, strontium, and zinc cations, and a chelating agent that has a complex formation constant (log K) for the metal cation of at least 3.5 and less than or equal to 4.5, and a log K for aluminum ion that is 7 or less. This developer composition can be used to process positive-working lithographic printing plate precursors to provide lithographic printing plates.

18 Claims, No Drawings

SILICATE-FREE DEVELOPER COMPOSITIONS

FIELD OF THE INVENTION

This invention relates to silicate-free, alkaline developer compositions and to their use in methods to process imaged positive-working lithographic printing plate precursors such as those containing vinyl acetal recurring units. This invention also relates to a method of using the developer compositions of this invention and to kit comprising the developer composition and one or more of the precursors.

BACKGROUND OF THE INVENTION

In conventional or "wet" lithographic printing, ink receptive regions, known as image areas, are generated on a hydrophilic surface. When the surface is moistened with water and lithographic printing ink is applied, the hydrophilic regions retain the water and repel the ink, and the ink receptive regions accept the ink and repel the water. The ink is eventually transferred to the surface of a material upon which the image is to be reproduced.

Lithographic printing precursors useful for preparing lithographic printing plates or sleeves typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the precursor is considered as positive-working. Conversely, if the non-imaged regions are removed, the precursor is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Lithographic printing precursors for the preparation of lithographic printing plates have been developed for use with infrared lasers that image in a platesetter in response to signals from a digital copy of the image in a computer. This "computer-to-plate" technology has generally replaced the former technology where masking films were used to image the precursors.

Positive-working imageable compositions containing one or more phenolic or vinyl acetal polymeric binders have been used in positive-working lithographic printing plate precursors for many years. For example, such imageable compositions are described in U.S. Pat. Nos. 7,399,576 (Levanon et al.) and 7,544,462 (Levanon et al.) and U.S. Patent Application Publications 2006/0154187 (Wilson et al.) and 2009/0162783 (Levanon et al.). However, there is a continuing need to improve their resistance to certain press chemicals and solvents.

It was found that solvent resistance could be improved using a poly(vinyl acetal) that also includes recurring units having hydroxyaryl ester groups, as described for example, in copending and commonly assigned U.S. Ser. No. 12/555,040 (filed Sep. 9, 2009 by Levanon, Bylina, Kampel, Rubin, Postel, Kurtser, and Nakash). While good run length and solvent resistance were obtained with these plates, there was a continued need to improve the development latitude in commonly-used developers.

It is quite common to design a specific developer composition that is optimized for developing a particular positive-working lithographic printing plate precursor. There have been attempts to do this by including coating protecting agents in the developer to reduce the solubility of the imageable coating in the non-exposed areas more effectively than the imageable coating in the exposed areas.

One of the common causes of short development cycle and excessive difficulty in cleaning the automatic processor relates to partial dissolution of aluminum oxide film on the substrate of typical lithographic printing plate precursors in the developer solution. Known techniques for reducing or eliminating such aluminum oxide attacks include the use of alkali silicates, non-reducing sugars, or lithium salts such as lithium chloride. However, the use of silicate salts itself adds to the dirtiness of the processor bath. It was found that developers containing lithium chloride are very slow in dissolving the infrared laser exposed coating containing polyvinyl acetal that also has hydroxyaryl ester groups and therefore are considered unsuitable for processing such precursors.

These problems are addressed using the method described and claimed in copending and commonly assigned U.S. application Ser. No. 12/948,808 filed on even date herewith by Levanon, Huang, and Askadsky and entitled METHODS OF PROCESSING USING SILICATE-FREE DEVELOPER COMPOSITIONS). Improved image discrimination was achieved with the described lithographic printing plate precursors by processing them using a developer composition having a pH of at least 12 and comprising at least 0.001 gram-atom/kg of a metal cation $M^{2+}$ such as barium, calcium, strontium, and zinc cation.

The presence of $M^{2+}$ cations such as calcium ions in the developer composition can also act to protect the aluminum substrate from attack by the alkaline developer solution.

During a processing cycle, when the developer is "loaded" with dissolved coating materials, a problem known as "sharpening" can become evident. "Sharpening" results from a change in the developer composition to be more aggressive in its developing activity so that non-exposed regions in the imageable layer are attacked by the developer, resulting in increased printing plate weight loss and decreased dot size (dot sharpening) in the resulting printed images.

These problems were addressed in our copending and commonly assigned U.S. application Ser. No. 12/948,812 (filed on even date herewith by us and entitled SILICATE-FREE DEVELOPER COMPOSITIONS.

However, there has been a desire in the industry to reduce or eliminate the presence of silicates and metasilicates in the developer compositions to increase cycle length and to improve processor cleanliness. While silicate-free developer compositions are known in the art, they are prone to increased attack of aluminum oxide coatings on the substrates. Calcium ions have then been used to reduce this problem but calcium salts and calcium hydroxide precipitation often occurs in the developer composition. Therefore, common chelating agents such as ethylenediaminetetraacetic acid (EDTA) and its salts have been added to the developer compositions. However, we have found that while many of these common chelating agents are effective to prevent calcium salt and hydroxide precipitation, but the same chelating agents also may reduce the effectiveness of calcium cations to protect the aluminum substrates and even increase the attack of the aluminum oxide by hydroxide-based developer composition containing non-optimized amounts of the chelating agents.

There is a desire, then, to provide silicate-free developer compositions containing chelating agents that do not promote the attack of the substrate over a very broad concentration window, and in which no precipitation of calcium or other cations used to protect the substrate occurs.

SUMMARY OF THE INVENTION

The present invention provides a silicate-free alkaline aqueous developer composition having a pH of at least 12 and comprising:
  a metal cation $M^{2+}$ selected from barium, calcium, strontium, and zinc cations, and
  a chelating agent that has a complex formation constant (log K) for the metal cation of at least 3.5 and less than or equal to 4.5, and a log K for aluminum ion that is 7 or less.

In some embodiments, this developer composition has a pH of at least 12 and up to and including 13.5, and further comprises an alkali agent that is a hydroxide, and a non-phosphono polycarboxylic acid or salt thereof having a molecular weight of less than 1000,
  $M^{2+}$ is calcium metal cation, and
  the chelating agent has a complex formation constant (log K) for the calcium metal cation of at least 3.5 and less than or equal to 4.5, and a log K for aluminum ion that is less than or equal to 7.

In still other embodiments, the developer composition has a pH of at least 12 and up to and including 13.5, and further comprises an alkali agent that is a hydroxide, citrate ion, $M^{2+}$ is calcium metal cation, and the chelating agent that is 2-phosphonobutane-1,2,4-tricarboxylic acid.

In addition, this provides a method for providing a lithographic printing plate comprising:
  A) imagewise exposing a positive-working lithographic printing plate precursor having a substrate and an imageable layer, to provide exposed and non-exposed regions in the imageable layer, and
  B) processing the exposed lithographic printing plate precursor with a developer composition of this invention to remove the exposed regions in the imageable layer.

Thus, this method can be used with a developer composition that has a pH of at least 12 and up to and including 13.5, and that comprises an alkali agent that is a hydroxide, an alkali metal salt of an organic or inorganic acid different from the chelating agent, $M^{2+}$ that is calcium metal cation, and a chelating agent has a complex formation constant (log K) for the calcium metal cation $M^{2+}$ of at least 3.5 and less than or equal to 4.5, and a log K for aluminum ion that is less than or equal to 7.

This invention also provides a kit useful for providing lithographic printing plates, the kit comprising:
  a) one or more positive-working lithographic printing plate precursors, each precursor having a substrate and an outermost imageable layer that comprises a polymer binder, and
  b) the silicate-free alkaline aqueous developer composition of this invention.

This kit includes a combination of the lithographic printing plate precursors that can be supplied in any number (usually in the hundreds) in suitable cartons or packages, and the noted developer composition that is generally supplied in suitable containers. The components of the kit can be separately ordered and supplied from a single or multiple sources or distributors, or they can be ordered and supplied together from the same source or distribution.

We discovered that the present invention solves a number of problems simultaneously. Since the developer compositions are silicate-free, processing cycle can be lengthened and the cleanliness of the processor and developer composition is improved. Attack of the substrate aluminum oxide layer is minimized by the presence of $M^{2+}$ cations (particular calcium), and we found that certain chelating agents could be used to keep the $M^{2+}$ cations in solution thereby preventing precipitation.

Not just any calcium (or cation) chelating agent can be used. Only the chelating agents having a complex formation constant (log K) for the $M^{2+}$ metal cation (for example calcium) of at least 3.5 and less than or equal to 4.5, and a log K for aluminum ion that is 7 or less, are useful. If the chelating agent complex formation constant for the $M^{2+}$ metal cation is too high (greater than 4.5), and the complex formation constant for aluminum is higher than 7, protection of the substrate is inadequate. If the chelating agent complex formation constant for the $M^{2+}$ metal cation is too low, there will be undesirable precipitation of the $M^{2+}$ cation salts and hydroxides. Thus, the chelating agent complex formation constant must be within a specific range to achieve all desired goals.

DETAILED DESCRIPTION OF THE INVENTION

As used herein, the terms "lithographic printing plate precursor", "printing plate precursor", "positive-working lithographic printing plate precursor", and "precursor" refer to the positive-working imageable elements that can be used in the practice of this invention.

Unless otherwise indicated, as used herein, the terms "developer composition" and "developer" refer to the compositions of the present invention.

Developer Compositions

There are various embodiments of developer compositions that can be used to advantage to solve one or more of the problems noted above. All of the developer compositions have a pH of at least 12 and typically at least 12 and up to and including 13.5, or more likely at least 12.5 and up to and including 13.5. This highly alkaline pH is generally provided using one or more alkali agents, as long as silicates and metasilicates are not present (not purposely added). Useful alkali agents include alkali metal hydroxides such as sodium hydroxide and potassium hydroxide. In some embodiments, both sodium and potassium ions are present as part of the alkali agents. In such embodiments, it is desirable that the potassium ions be more prevalent than the sodium ions, for example at a molar ratio of potassium to sodium ions of greater than 1:1. The total amount of the alkali metal ions is generally at least 0.3 and up to and including 1 gram-atom/kg.

The developer compositions also include one or more metal cations ($M^{2+}$) that are generally selected from barium, calcium, strontium, and zinc cations. Calcium, strontium, and zinc cations are particularly useful, and in some embodiments, calcium is particularly advantageous to protect the surface of the imageable layer containing certain polymeric binders, for example polymeric binder comprising recurring units defined by Structure (Ib) noted below.

The metal cations $M^{2+}$ are generally present in the developer compositions in an amount of at least 0.001 gram-atom/kg, and typically at least 0.001 and up to and including 0.01 gram-atom/kg. The metal cations $M^{2+}$ can be introduced to the developer composition using corresponding salts.

In additions, the developer compositions include one or more chelating agents, each of which has a complex formation constant (log K) for the calcium metal cation of at least 3.5 and less than or equal to 4.5, and a log K for aluminum ion that is 7 or less. In many embodiments, the $M^{+2}$ metal cation that is used with the chelating agent is either calcium or strontium, and calcium is the most likely metal cation in this instance.

Useful chelating agents with these properties include but are not limited to, phosphono-polycarboxylic acids such as phosphonoalkyl polycarboxylic acids, such as 2-phosphonobutane-1,2,4-tricarboxylic acid, which is particularly useful with calcium metal cations.

The described chelating agents can be present in an amount of at least 0.01 and up to and including 0.1 mol/liter, or typically at least 0.03 and up to and including 0.1 mol/liter.

The developer composition can also include one or more alkali metal salts having one or more $X^{n-}$ anions or salts thereof. Such anions are different than any anions provided by any other components of the developer composition. These anions can be anions of inorganic or organic carboxylic acids. Such anions generally do not include phosphono groups, unlike the chelating agents described above. Examples of useful $X^{n-}$ anions (and anion portions of corresponding salts) include but are not limited to, nitric acid (nitrate), carbonic acid (carbonate), citric acid (citrate), acetate, tartaric acid (tartrate), and oxalate. Citrate alkali metal salts are particularly useful. The salts are generally present in an amount of at least 0.05 mol/liter and up to and including 0.2 mol/liter, and typically at least 0.07 mol/liter and up to and including 0.15 mol/liter.

An optional but desirable component of the developer compositions is a cationic surfactant or betaine. Two or more cationic surfactants can also be used, and the total amount is generally at least 0.01 weight % and typically at least 0.1 and up to and including 3 weight %. The cationic surfactant can moderate the developer composition aggressiveness in the non-imaged areas (areas not to be removed) of the imaged lithographic printing precursor, especially those comprising recurring units represented by Structure (Ia) below. Suitable cationic surfactants for use in the present invention include, but are not limited to, quaternary ammonium halides of fatty acids. One example of such cationic surfactants is Hydromax 300 that is described for example, in U.S. Patent Application Publication 2006/0154187 (Wilson et al.).

The developer composition can also comprise one or more surfactants to achieve the best wetting, stabilizing, solubilizing, protecting, dispersing, or rinsing properties. Such surfactants are generally anionic or nonionic in nature. Both types can be present. Useful anionic surfactants are of the alkyaryl sulfonates class, such as an alkylaryl sulfonate, for example, alkyldiphenyloxide disulfonate that is available as Dowfax® 2A1 from Dow Chemical Company. The anionic and nonionic surfactants can be present in an amount of at least 0.1 and up to and including 2 weight %.

The developer compositions can further comprise materials that are conventional components of developers, such as hydrotropes, biocides, antifoaming agents and gumming materials that provide protection of the developed printing plate, all in known quantities.

The developer composition can be prepared by dissolving the components in water. It can be supplied in a form ready to use, or it can also be provided in a form of a concentrate, which is diluted at least 1.5 and up to and including 2.5 times with water or an aqueous alkaline solution prior to use.

Although each developer composition can also be used as its own replenisher, more likely, a specially formulated replenisher can be used. In the replenisher composition, the concentration of alkali agent is generally higher than the concentration of the alkali agent in the developer composition, to compensate for the consumption of the alkali agent during the development process. There is often a correlation between the value of the ionic conductivity and the value of alkalinity of the total developer composition bath.

In some embodiments, the replenisher composition not only has greater alkali agent (such as a hydroxide), but it can also have an increased amount of the $M^{2+}$ cation, chelating agent, or cationic surfactant.

Positive-working Lithographic Printing Plate Precursors

The present invention can be used to process imaged positive-working imageable element comprising a substrate having thereon an imageable layer comprising a water-insoluble polymeric binder, and a radiation absorbing compound, wherein the polymeric binder comprises, in random fashion:

a) vinyl acetal recurring units comprising pendant hydroxyaryl groups, b) recurring units comprising hydroxyaryl ester groups, or c) either or both types of recurring units (Ia) and (Ib), in random fashion.

For purposes of this disclosure, the polymeric binder defined as comprising at least recurring units of Structure (Ia) or (Ib), or both Structures (Ia) and (Ib), in random fashion, are considered as "primary" polymeric binders. As noted below, the primary polymeric binders must be present in the imageable layer, but they are not necessarily the only polymeric binders in the imageable layer.

In most embodiments, the polymeric binder comprises recurring units represented by either or both of the following Structures (Ia) and (Ib), in random fashion:

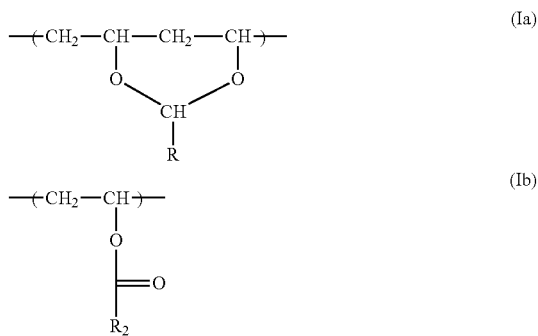

that are described in more detail below. When both Structure (Ia) and (Ib) recurring units are present, the Structure (Ia) recurring units are present for at least 10 and up to and including 35 mol %, the Structure (Ib) recurring units are present for at least 25 and up to and including 60 mol %, all based on the total recurring units in the polymeric binder, and in random fashion.

Still other embodiments include the use of a polymeric binder that comprises, in random fashion, in addition to the recurring units from Structures (Ia) and (Ib), of at least 25 and up to and including 60 mol % of recurring units represented by the following Structure (Ic):

and optionally up to 25 mol % of recurring units represented by the following Structure (Id), optionally up to 10 mol % of recurring units represented by the following Structure (Ie), and optionally up to 20 mol % of recurring units represented by the following Structure (If), in random fashion, all based on the total recurring units in the polymeric binder:

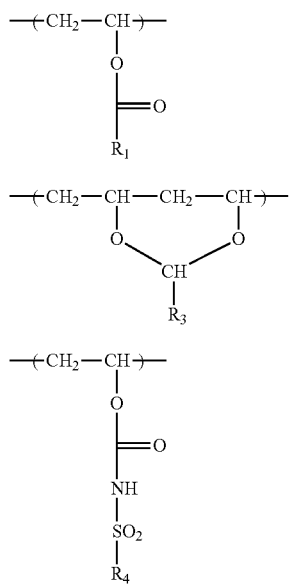

which Structures (Ic) through (If) are described in more detail below.

In Structures (Ia) and (Ib), R is a substituted or unsubstituted hydroxyaryl group such as a substituted or unsubstituted hydroxyphenyl or hydroxynaphthyl group wherein the aryl group has 1 to 3 hydroxyl groups on the ring. Typically, there is only 1 hydroxyl group on the aryl ring. Other substituents that can optionally be present on the aryl group include but are not limited to, alkyl, alkoxy, halogen, and any other group that does not adversely affect the performance of the polymeric binder in the imageable element.

$R_2$ is a substituted or unsubstituted hydroxyaryl group in which the hydroxyl group is ortho to the ester linkage. Some of the $R_2$ groups are substituted with a cyclic imide group, for example a substituted or unsubstituted hydroxyphenyl or hydroxynaphthyl group that has a cyclic imide substituent such as an aliphatic or aromatic imide group, including but not limited to, maleimide, phthalimide, tetrachlorophthalimide, hydroxyphthalimide, carboxyphthalimide, and naphthalimide groups. Further optional substituents on $R_2$ include but are not limited to, hydroxyl, alkyl, alkoxy, halogen, and other groups that do not adversely affect the properties of the cyclic imide group or the polymeric binder in the imageable element. A hydroxyphenyl group, with a cyclic imide substituent and no other substituents, is useful in the polymeric binder.

In Structure (Id), $R_1$ is hydrogen or a substituted or unsubstituted linear or branched alkyl group having 1 to 12 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, iso-hexyl, and dodecyl groups), a substituted or unsubstituted cycloalkyl having 5 to 10 carbon atoms in the carbocyclic ring (such as cyclopentyl, cyclohexyl, 4-methylcyclohexyl, and 4-chlorocyclohexyl), or a substituted or unsubstituted aryl group having 6 or 10 carbon atoms in the aromatic ring (such as phenyl, naphthyl, p-methylphenyl, and p-chlorophenyl). Such groups can be substituted with one or more substituents such as alkyl, alkoxy, and halogen, or any other substituent that a skilled worker would readily contemplate that would not adversely affect the performance of the polymeric binder in the imageable element.

In Structure (Ie), $R_3$ is an aryl group (such as phenyl or naphthyl group) that is substituted with an —$O_x$—$(CH_2)_y$—COOH group wherein x is 0 or 1 and y is 0, 1, or 2. Typically, x is 1 and y is 1, and the aryl group is a phenyl group. This aryl group can have further substituents such as alkyl, alkoxy, or halogen that do not adversely affect the performance of the polymeric binder in the imageable element.

In Structure (If), $R_4$ is a substituted or unsubstituted aryl group having 6 or 10 carbon atoms in the aromatic ring (such as phenyl or naphthyl) and that can have one or more substituents such as alkyl, alkoxy, and others that a skilled worker would readily contemplate as not adversely affecting the properties of the polymeric binder in the imageable element.

In some embodiments, the polymeric binder comprises recurring units represented by each of Structures (Ia) through (If), in random fashion:

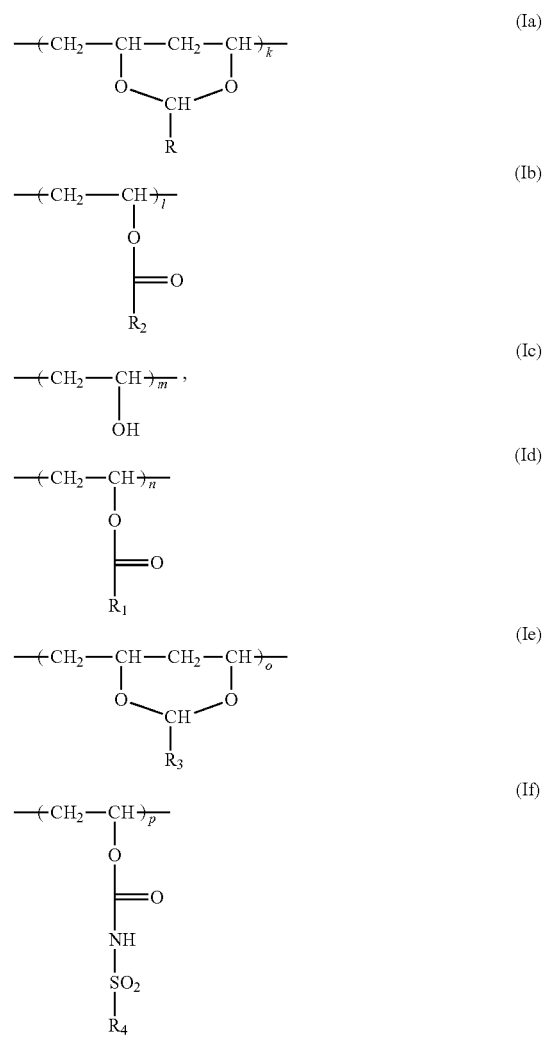

wherein R, $R_1$, $R_2$, $R_3$, $R_4$, x and y are as defined above, k is at least 15 and up to and including 25 mol %, l is at least 25 and up to and including 45 mol %, m is at least 30 and up to and including 55 mol %, n is 0 or up to and including 15 mol %, is 0 or up to and including 8 mol %, and p is from 0 to about 10 mol %, all in random fashion and all based on total recurring units in the polymeric binder.

In yet other embodiments, the polymeric binder comprises recurring units represented by each of Structures (Ia) through (Id), in random fashion:

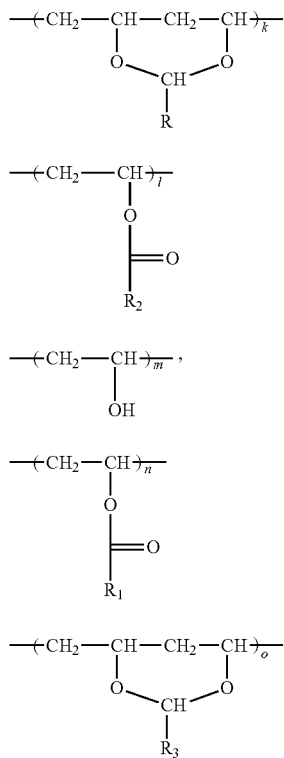

wherein R, $R_1$, and $R_2$ are as defined above.

Further, other embodiments include the use of the polymeric binder that comprises recurring units represented by each of Structures (Ia) through (Ie), in random fashion:

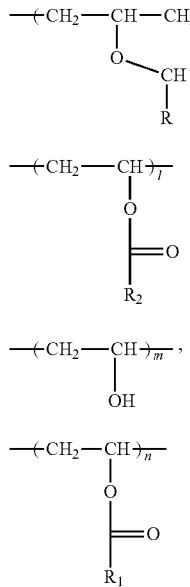

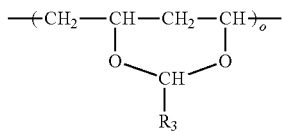

wherein R, $R_1$, $R_2$, $R_3$, x, and y are as defined above.

A primary polymeric binder comprising recurring units that are represented by Structures (Ia) or (Ib), or both Structures (Ia) and (Ib) and optionally (Ic), (Id), (Ie), or (If) can contain recurring units other than those defined by the illustrated recurring units and such additional recurring units would be readily apparent to a skilled worker in the art. Thus, the polymeric binders useful in this invention are not limited specifically to the recurring units defined by Structures (Ia) through (If). Where two or more types of recurring units are present in the primary binder, the recurring units are present in a random fashion.

There also can be multiple types of recurring units from any of the defined classes of recurring units in Structures (Ia), (Ib), (Id), (Ie), and (If) with different substituents. For example, there can be multiple types of recurring units with different R groups, there can be multiple types of recurring units with different $R_1$ groups, there can be multiple types of recurring units with different $R_2$ groups, there can be multiple types of recurring units with different $R_3$ groups, or there can be multiple types of recurring units with different $R_4$ groups. In addition, the number and type of recurring units in the primary polymeric binders are generally in random sequence, but blocks of specific recurring units can also be present inadvertently.

The primary polymeric binder is generally present in an amount of at least 40 and up to and including 95 weight % (typically for at least 50 and up to and including 80 weight %) based on the total dry weight of the imageable layer.

The primary polymer binders used in the present invention can be prepared by trans-esterification of alkyl or aryl esters of hydroxy-substituted aromatic acids with polyvinyl alcohol in the presence of basic catalysts such as metal hydroxides, metal alkoxides, and cyclic amines in dimethylsulfoxide (DMSO) or N-methylpyrrolidone (NMP) or mixtures of these solvents with γ-butyrolactone (BLO).

Some embodiments of the primary polymeric binders have pendant hydroxyaryl groups that are substituted with a cyclic imide (such as a phthalimide group) on the aromatic ring. Such polymers can be prepared by trans-esterification of cyclic imide derivatives of alkyl or aryl esters of hydroxyl-substituted aromatic acids with polyvinyl alcohol in the presence of basic catalysts such as metal hydroxides, metal alkoxides or cyclic amines in DMSO or NMP, or mixtures of these solvents with BLO or by trans-esterification of mixtures of cyclic imide derivatives of alkyl and aryl esters of hydroxyl-substituted aromatic acids with polyvinyl alcohol in the presence of basic catalysts such as metal hydroxides, metal alkoxides or cyclic amines in DMSO or NMP or mixtures of these solvents with BLO.

These primary polymeric binders can be used alone or in admixture with other alkali soluble polymeric binders, identified herein as "secondary polymeric binders". These additional polymeric binders include other poly(vinyl acetal)s, for example, the poly(vinyl acetal)s described in U.S. Pat. Nos. 6,255,033 and 6,541,181 (noted above), WO 04/081662 (also noted above), and in U.S. Patent Application Publication 2008/0206678 (Levanon et al.), which publications are incorporated herein by reference.

The type of the secondary polymeric binder that can be used together with the primary polymeric binder is not particularly restricted. In general, from a viewpoint of not diminishing the positive radiation-sensitivity of the imageable element, the secondary polymeric binder is generally an alkali-soluble polymer also.

Other useful secondary polymeric binders include phenolic resins, including novolak and resole resins such as condensation polymers of phenol and formaldehyde, condensation polymers of m-cresol and formaldehyde, condensation polymers of p-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Examples of other useful secondary polymeric binders include the following classes of polymers having an acidic group in (1) through (5) shown below on a main chain and/or side chain (pendant group).

(1) sulfone amide ($-SO_2NH-R'$),
(2) substituted sulfonamido based acid group (hereinafter, referred to as active imido group) [such as $-SO_2NHCOR'$, $SO_2NHSO_2R'$, $-CONHSO_2R'$],
(3) carboxylic acid group ($-CO_2H$),
(4) sulfonic acid group ($-SO_3H$), and
(5) phosphoric acid group ($-OPO_3H_2$).

R' in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfonamide group such as m-aminosulfonylphenyl methacrylate, N-(p-aminosulfonylphenyl)methacrylamide, or N-(p-aminosulfonylphenyl)acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula.

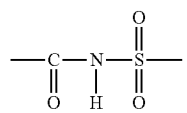

N-(p-toluenesulfonyl)methacrylamide and N-(p-toluenesulfonyl)acrylamide are examples of such polymerizable compounds.

Secondary polymeric binders having any of the groups (3) through (5) include those readily prepared by reacting ethylenically unsaturated polymerizable monomers having the desired acidic groups, or groups that can be converted to such acidic groups after polymerization.

The secondary polymeric binder can have a weight average molecular weight of at least 2,000 and a number average molecular weight of at least 500. Typically, the weight average molecular weight is at least 5,000 and up to and including 300,000, the number average molecular weight is at least 800 and up to and including 250,000, and the degree of dispersion (weight average molecular weight/number average molecular weight) is at least 1.1 and up to and including 10.

Mixtures of the secondary polymeric binders can be used with the one or more primary polymeric binders. The secondary polymeric binder(s) can be present in an amount of at least 1 weight % and up to and including 50 weight %, and typically at least 5 and up to and including 30 weight %, based on the dry weight of the total polymeric binders in the radiation-sensitive composition or imageable layer.

The radiation-sensitive composition can also include one or more developability-enhancing compounds. WO 2004/081662 (Memetea et al.) describes the use of various developability-enhancing compounds of acidic nature to enhance the sensitivity of positive-working compositions and elements so that required imaging energy is reduced. Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides can permit further improved developing latitude and printing durability. Representative examples of such compounds are provided in [0030] to [0036] of U.S. Patent Application Publication 2005/0214677 (noted above) that is incorporated herein by reference with respect to these acid developability-enhancing compounds.

The imageable layer can also include a developability-enhancing composition containing one or more basic developability-enhancing compounds (BDEC) as described in U.S. Pat. No. 7,544,462 (Levanon et al.) and one or more developability enhancing compounds (DEC) as described in U.S. Patent Publication No. 2009/0162783 (Levanon et al.), both which are incorporated herein by reference. For example, the DEC compounds are organic compounds having at least one amino group and at least one carboxylic acid group, particularly if at least one amino group is directly linked to an aryl group. The DEC compounds can be represented by the following Structure (DEC):

wherein $R_1$ and $R_2$ are independently hydrogen or substituted or unsubstituted alkyl, substituted or unsubstituted cycloalkyl, or substituted or unsubstituted aryl groups, A is a substituted or unsubstituted organic linking group having at least one carbon, nitrogen, sulfur, or oxygen atom in the chain, wherein A also comprises a substituted or unsubstituted arylene group directly connected to $-[N(R_1)(R_2)]_n$, m is an integer of 1 to 4, and n is an integer of 1 to 4.

The lithographic printing plate precursors are positive-working and the primary polymeric binders described herein are present in a single surface imageable layer.

This surface imageable layer can also contain hydroxymandelic acid in an amount of at least 0.1 and up to and including 10 weight % based on the total imageable layer dry weight.

The lithographic printing plate precursors used in this invention are positive-working and the primary polymeric binders described herein are generally present as polymeric binders in a single imageable layer.

In general, the lithographic printing plate precursors are formed by suitable application of a formulation of the radiation-sensitive composition that contains one or more primary polymeric binders, a radiation absorbing compound (described below), optionally a developability-enhancing composition, and other optional addenda, to a suitable substrate to form an imageable layer. This substrate is usually treated or coated in various ways as described below prior to application of the formulation. For example, the substrate can be treated to provide an "interlayer" for improved adhesion or hydrophilicity, and the imageable layer is applied over the interlayer.

The substrate generally has a hydrophilic surface, or a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that can be coated or treated using techniques known in the art, including physical graining, electrochemical graining and chemical graining, followed by anodizing. The aluminum sheet is mechanically or electrochemically grained and anodized using phosphoric acid or sulfuric acid and conventional procedures.

An optional interlayer can be formed by treatment of the aluminum support with, for example, a silicate, dextrine, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution, or an alkali salt of a condensed aryl sulfonic acid as described in GB 2,098,627 and Japanese Kokai 57-195697A (both Herting et al.). The grained and anodized aluminum support can be treated with a solution of a phosphate (such as $NaH_2PO_4$) and sodium fluoride using known procedures to improve surface hydrophilicity.

The thickness of the substrate can be varied but should be sufficient to sustain the wear from printing and thin enough to wrap around a printing form. Some embodiments include a treated aluminum foil having a thickness of at least 100 and up to and including 600 µm.

The backside (non-imaging side) of the substrate can be coated with a slipping or matte layer to improve handling and "feel" of the lithographic printing plate precursor.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer (and radiation-sensitive composition) typically also comprises one or more radiation absorbing compounds that are typically sensitive to infrared radiation and thus, the radiation absorbing compounds are known as infrared radiation absorbing compounds ("IR absorbing compounds") that generally absorb radiation from at least 700 and up to and including 1400 nm and typically for at least 750 and up to and including 1250 nm. The imageable layer is generally the outermost layer in the lithographic printing plate precursor. Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. Nos. 4,973,572 (DeBoer), 5,208,135 (Patel et al.), 5,244,771 (Jandrue Sr. et al.), and 5,401,618 (Chapman et al.), and EP 0 823 327A1 (Nagasaka et al.).

Cyanine dyes having an anionic chromophore are also useful. For example, the cyanine dye can have a chromophore having two heterocyclic groups. In another embodiment, the cyanine dye can have from about two sulfonic acid groups, such as two sulfonic acid groups and two indolenine groups as described for example in U.S Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

In the lithographic printing plate precursors, the radiation absorbing compound is generally present at a dry coverage of at least 0.1 and up to and including 30 weight %, or it is an IR dye that is present in an amount of from at least 0.5 and up to and including 15 weight %. The particular amount needed for this purpose would be readily apparent to one skilled in the art, depending upon the specific compound used.

Alternatively, the radiation absorbing compounds can be included in a separate layer that is in thermal contact with the imageable layer. Thus, during imaging, the action of the radiation absorbing compound in the separate layer can be transferred to the imageable layer without the compound originally being incorporated into it.

The imageable layer (and radiation-sensitive composition) can also include one or more additional compounds that are colorant pigments or dyes, or UV or visible light-sensitive components. Pigment colorants can be organic colorants that are generally insoluble in less than 0.1 g/liter of coating solvents that are generally used to apply the radiation-sensitive imageable layer to a substrate. Such coating solvents generally have hydroxyl, ester, ether, carbonyl, carboxy, amide, or nitrile groups and having a boiling point of at least 30° and up to and including 250° C. Classes of useful pigment colorants include but are not limited to, phthalocyanines, perylenes, and azo pigments. Colorant dyes that are soluble in an alkaline developer are also useful. Useful colorant dyes include triarylmethane dyes such as ethyl violet, crystal violet, malachite green, brilliant green, Victoria blue B, Victoria blue R, and Victoria pure blue BO, BASONYL®Violet 610 and D11 (PCAS, Longjumeau, France). These compounds can act as contrast dyes that distinguish the non-exposed (non-imaged) regions from the exposed (imaged) regions in the developed lithographic printing plate.

The imageable layer (and radiation-sensitive composition) can further include a variety of additives including dispersing agents, humectants, biocides, plasticizers, surfactants for coatability or other properties, viscosity builders, fillers and extenders, pH adjusters, drying agents, defoamers, preservatives, antioxidants, development aids, rheology modifiers or combinations thereof, or any other addenda commonly used in the lithographic art, in conventional amounts.

The positive-working lithographic printing plate precursors can be prepared by applying the imageable layer (radiation-sensitive composition) formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the imageable layer is at least 0.5 and up to and including 3.5 g/m$^2$ and typically at least 1 and up to and including 3 g/m$^2$.

The selection of solvents used to coat the layer formulation(s) depends upon the nature of the polymeric binders and other polymeric materials and non-polymeric components in the formulations. Generally, the imageable layer formulation is coated out of acetone, methyl ethyl ketone, or another ketone, tetrahydrofuran, 1-methoxy-2-propanol, N-methylpyrrolidone, 1-methoxy-2-propyl acetate, γ-butyrolactone, and mixtures thereof using conditions and techniques well known in the art.

Intermediate drying steps can be used between applications of the various layer formulations to remove solvent(s) before coating other formulations. Drying steps can also help in preventing the mixing of the various layers.

Representative methods for preparing positive-working lithographic printing plate precursors are described below in the examples.

After the imageable layer formulation is dried on the substrate (that is, the coating is self-supporting and dry to the touch), the lithographic printing plate precursor can be heat treated at a temperature of at least 40 and up to and including 90° C. (typically at least 50 and up to and including 70° C.) for at least 4 hours and typically at least 20 hours, or for at least 24 hours. The maximum heat treatment time can be several days, but the optimal time and temperature for the heat treatment can be readily determined by routine experimentation. This heat treatment can also be known as a "conditioning" step. Such treatments are described for example, in EP 823,327 (Nagasaka et al.) and EP 1,024,958 (McCullough et al.).

It is also be desirable that during the heat treatment, the lithographic printing plate precursor is wrapped or encased in a water-impermeable sheet material to represent an effective barrier to moisture removal from the precursor. More details of this process are provided in U.S. Pat. No. 7,175,969 (Ray et al.).

Imaging and Development

The lithographic printing plate precursors used in this invention can have any useful form. The precursors can be of any useful size and shape (for example, square or rectangular) having the requisite positive-working imageable layer disposed on a suitable substrate.

During use, the lithographic printing plate precursors are exposed to a suitable source of infrared radiation at a wavelength using an infrared laser at a wavelength of at least 700 and up to and including 1400 nm. The laser used to expose the imaging member is can be a diode laser, because of the reliability and low maintenance of diode laser systems, but other lasers such as gas or solid-state lasers can also be used. The combination of power, intensity and exposure time for laser imaging would be readily apparent to one skilled in the art. Presently, high performance lasers or laser diodes used in commercially available imagesetters emit infrared radiation at one or more wavelengths with the range of at least 750 and up to and including 1250 nm.

The imaging apparatus can function solely as a platesetter or it can be incorporated directly into a lithographic printing press. In the latter case, printing can commence immediately after imaging, thereby reducing press set-up time considerably. The imaging apparatus can be configured as a flatbed recorder or as a drum recorder, with the lithographic printing plate precursor mounted to the interior or exterior cylindrical surface of the drum. A useful imaging apparatus is available as models of Kodak Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image a lithographic printing plate precursor while it is attached to the printing plate cylinder. An example of a suitable direct imaging printing press includes the Heidelberg SM74-DI press (available from Heidelberg, Dayton, Ohio). IR Imaging speeds can be from at least 30 and up to and including 1500 mJ/cm$^2$ or typically at least 40 and up to and including 300 mJ/cm$^2$.

While laser imaging is usually practiced, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files can be generated by a raster image processor (RIP) or other suitable means. The bitmaps are constructed to define the hue of the color as well as screen frequencies and angles.

Imaging of the lithographic printing plate precursor produces an imaged precursor that comprises a latent image of imaged (exposed) and non-imaged (non-exposed) regions. Developing the imaged precursor with the developer composition of this invention removes predominantly only the exposed regions of the imageable layer and any layers underneath it, and exposing the hydrophilic surface of the substrate (that generally contains aluminum). Development is carried out for a time sufficient to remove the imaged (exposed) regions of the imageable layer, but not long enough to remove the non-imaged (non-exposed) regions of the imageable layer. The imaged (exposed) regions of the imageable layer are described as being "soluble" or "removable" in the developer composition because they are removed, dissolved, or dispersed within the developer more readily than the non-imaged (non-exposed) regions of the imageable layer. Thus, the term "soluble" also means "dispersible".

Generally, the developer composition can be applied to the imaged precursor by rubbing or wiping it with an applicator containing the developer composition. Alternatively, the imaged precursor can be brushed with the developer composition, or the developer composition can be applied by spraying the imaged precursor with sufficient force to remove the exposed regions. Still again, the imaged precursor can be immersed in the developer composition. In all instances, a developed image is produced in a lithographic printing plate. Development can be carried out in suitable apparatus containing suitable rollers, brushes, tanks, and plumbing for delivery, disposal, or recirculation of solutions if desired. Development using dip tanks are particularly useful.

The developer composition can be added as a "working strength" solution, or it can be added as a "concentrate" that can be diluted at least 1.5 times and up to and including 2.5 times with water or an aqueous alkaline solution. The concentrated form of the developer compositions would then have appropriate concentrations of the various components so that, upon dilution with water or an aqueous alkaline solution, or both, the resulting working strength developer composition then has the desired amounts of each component.

During development, the developer composition can be replenished with fresh amounts of the same solution, or it can be replenished with a developer composition replenisher that has similar or different concentrations of various components. For example, the developer replenisher composition can have a higher concentration of alkali agent, $M^{2+}$ metal cation, as well as other components such as cationic surfactant or chelating agent. The higher concentration can be as little as 5% higher and up to and including 20% higher concentrations of the desired components.

The rate of replenishment would be readily determined by routine experimentation based on the area of precursors being processed. In most instances, the rate of replenishment can be monitored and controlled by measuring the conductivity of the developer composition in the processing tank, to maintain the conductivity as close to a target conductivity as possible. If the conductivity becomes too high during replenishment, a diluent such as plain water can also be added to the processing tank.

Following development, the imaged precursor can be rinsed with water and dried in a suitable fashion. The dried precursor can also be treated with a conventional gumming solution (preferably gum arabic).

The resulting lithographic printing plate can also be baked in a post-exposure bake operation that can be carried out to increase run length. Baking can be carried out, for example at a temperature of at least 220° C. and up to and including 260° C. for at least 1 and up to and including 10 minutes, or at about 120° C. for about 30 minutes.

Printing can be carried out by applying a lithographic ink and fountain solution to the printing surface of the lithographic printing plate. The ink is taken up by the non-imaged (non-exposed or non-removed) regions of the imageable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the printing plate to the receiving material. The lithographic printing plates can be cleaned between impressions, if desired, using conventional cleaning means and chemicals.

The present invention provides at least the following embodiments and combinations thereof, but other combinations of features are considered to be within the present invention as a skilled artisan would appreciate from the teaching of this disclosure:

1. A silicate-free alkaline aqueous developer composition having a pH of at least 12 and comprising:
a metal cation $M^{2+}$ selected from barium, calcium, strontium, and zinc cations, and
a chelating agent that has a complex formation constant (log K) for the metal cation of at least 3.5 and less than or equal to 4.5, and a log K for aluminum ion that is 7 or less.

2. The developer composition of embodiment 1 wherein the metal cation $M^{2+}$ is calcium, strontium, or zinc.

3. The developer composition of embodiment 1 or 2 wherein the chelating agent has a log K for calcium of from 3.5 to 4.5 and a log K for aluminum ion that is less than 7.

4. The developer composition of any of embodiment 1 to 3 that has a pH of at least 12 and up to and including 13.5.

5. The developer composition of any of embodiments 1 to 4 further comprising an alkali metal salt that is at least one of a citrate, acetate, tartrate, nitrate, and oxalate.

6. The developer composition of any of embodiments 1 to 5 wherein the chelating agent is a phosphono-polycarboxylic acid.

7. The developer composition of any of embodiments 1 to 6 wherein the chelating agent is 2-phosphonobutane-1,2,4-tricarboxylic acid.

8. The developer composition of any of embodiments 1 to 7 wherein the $M^{2+}$ is present in an amount of at least 0.001 and up to and including 0.01 gram-atom/kg.

9. The developer composition of any of embodiments 1 to 8 wherein the chelating agent is present in an amount of at least 0.01 and up to and including 0.1 mol/liter.

10. The developer composition of any of embodiments 1 to 9 comprising either or both of an anionic surfactant and a cationic surfactant.

11. The developer composition of any of embodiments 1 to 10 having a pH of at least 12 and up to and including 13.5, and further comprising an alkali agent that is a hydroxide and an alkali metal salt other than the chelating agent, $M^{2+}$ is calcium metal cation, and the chelating agent has a complex formation constant (log K) for the calcium metal cation of at least 3.5 and less than or equal to 4.5, and a log K for aluminum ion that is less than or equal to 7.

12. The developer composition of embodiment 11 wherein the chelating agent is 2-phosphonobutane-1,2,4-tricarboxylic acid.

13. The developer composition of any of embodiments 1 to 12 having a pH of at least 12 and up to and including 13.5, and further comprising a hydroxide and a alkali metal salt that is a citrate, $M^{2+}$ is calcium metal cation, and the chelating agent that is 2-phosphonobutane-1,2,4-tricarboxylic acid.

14. The developer composition of embodiment 13 further comprising a cationic surfactant.

15. A method for providing a lithographic printing plate comprising:

A) imagewise exposing a positive-working lithographic printing plate precursor having a substrate and an imageable layer, to provide exposed and non-exposed regions in the imageable layer, and B) processing the exposed lithographic printing plate precursor with the developer composition of any of embodiments 1 to 14 to remove the exposed regions in the imageable layer.

16. The method of embodiment 15 wherein the positive-working lithographic printing plate precursor has an aluminum-containing substrate and a single imageable layer disposed on the substrate.

17. The method of embodiment 15 or 16 wherein the positive-working lithographic printing plate precursor contains an infrared radiation absorbing compound in the imageable layer, and the imagewise exposure is carried out using infrared radiation.

18. The method of any of embodiments 15 to 17 wherein the imageable layer comprises a polymeric binder comprising recurring units represented by either or both of the following Structures (Ia) and (Ib), in random order:

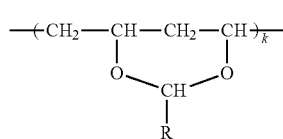

(Ia)

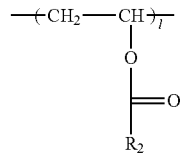

(Ib)

wherein:

when both the Structure (Ia) and (Ib) recurring units are present, the Structure (Ia) recurring units are present in an amount of at least 10 and up to and including 35 mol %, and the Structure (Ib) recurring units are present in an amount of at least 25 and up to and including 60 mol %, all based on total recurring units in the polymeric binder, R is a substituted or unsubstituted hydroxyaryl group, and $R_2$ is a substituted or unsubstituted hydroxyaryl group in which the hydroxyl group is ortho to the ester linkage.

19. The method of any of embodiments 15 to 18 wherein the positive-working lithographic printing plate precursor has a surface imageable layer containing hydroxymandelic acid, an organic compound having at least one amino group and at least one carboxylic acid group directly linked to an aryl group, or both hydroxymandelic acid and at least one of the organic compounds.

20. The method of any of embodiments 15 to 19 wherein the developer composition has a pH of at least 12 and up to and including 13.5, and comprises a hydroxide, an alkali metal salt other than the chelating agent, $M^{2+}$ that is calcium metal cation, and a chelating agent has a complex formation constant (log K) for the calcium metal cation of at least 3.5 and less than or equal to 4.5, and a log K for aluminum ion that is less than or equal to 7.

21. The method of embodiment 20 wherein the chelating agent is 2-phosphonobutane-1,2,4-tricarboxylic acid.

22. The method of any of embodiments 15 to 21 that has a pH of at least 12 and up to and including 13.5, and comprises a hydroxide, citrate, $M^{2+}$ that is calcium metal cation, and a chelating agent that is 2-phosphonobutane-1,2,4-tricarboxylic acid.

23. The method of any of embodiments 15 to 22 wherein the developer composition comprises a cationic surfactant, and optionally an anionic surfactant.

24. The method of any of embodiments 15 to 23 that is carried out in a processing apparatus to which the developer composition is supplied as a concentrate that is diluted at least 1.5 times for use in step B with water or an aqueous alkaline solution.

25. The method of any of embodiments 15 to 24 wherein the positive-working lithographic printing plate precursor comprises a grained and anodized aluminum support that has been treated with a solution of a $NaH_2PO_4$ and sodium fluoride.

26. A kit useful for providing lithographic printing plates, the kit comprising:

a) one or more positive-working lithographic printing plate precursors, each precursor having a substrate and an outermost imageable layer that comprises a polymer binder, and b) a silicate-free alkaline aqueous developer composition of any of embodiments 1 to 15.

The following Examples are provided to illustrate the practice of this invention and they are not meant to be limiting to the scope of the invention in any manner.

The following materials were used in the preparation and use of the examples. Unless otherwise indicated, the materials were obtained from Aldrich Chemical Company (Milwaukee, Wis.).

Bayhibit® AM is a 50% aqueous solution of 2-phosphonobutane-1,2,4-tricarboxilic acid, "PBTC" (Bayer AG).

Hydromax 300 is a 40% aqueous solution of an organic fatty acid quaternary ammonium chloride mixture (Chemax Performance Products, Greenville, S.C.).

Dowfax® 2A1 is an anionic alkyldiphenyloxide disulfonate (Dow Chemical Company).

Potassium citrate is citric acid tripotassium salt, monohydrate.

Sodium citrate is citric acid trisodium salt dihydrate.

Potassium nitrate is nitric acid potassium salt.

ABA represents 4-aminobenzoic acid.

BLO represents γ-butyrolactone.

BPA 1100 is a resole resin that was obtained from AZEM (Wiesbaden).

DBU represents 1,8-diazabicyclo[5,4,0]undec-7-ene (98%).

Dioxalane is 1,3-dioxalane.

DMABA represents 4-(dimethylamino)benzoic acid.

DMSO represents dimethylsulfoxide.

MEK represents methyl ethyl ketone.

NMP represents N-methylpyrrolidone.

Polyfox® PF 652 is a surfactant (Omnova).

PM represents 1-methoxy-2-propanol that can be obtained as Arcosolve® PM from LyondellBasell Industries (the Netherlands).

S0094 is an infrared radiation absorbing dye ($\lambda_{max}$=813 nm) that was obtained from FEW Chemicals (Germany).

Sudan Black B is a neutral diazo dye (C.U. 26150).

Victoria Blue R is a triarylmethane dye (Basic Blue 11, C.I. 44040).

EDDS represents ethylene diamine-N,N'-disuccinic acid, trisodium salt.

EDTA represents ethylenediamine tetracetic acid, disodium salt.

DTPA represents diethyltriamine pentaacetic acid.

NTA represents nitrilo-triacetic acid.

Precursor 1:

Precursor 1 was prepared according to Example 12 of copending and commonly assigned U.S. Ser. No. 12/555,040 that is incorporated herein by reference, with the exception that instead of Polymer I, Polymer H was used. The imageable layer was prepared from a coating formulation containing the following components:

| | |
|---|---|
| Polymer H | 0.762 g |
| BPA1100 | 0.12 g |
| S 0094 IR Dye | 0.026 g |
| Victoria Blue R | 0.011 g |
| Sudan Black B | 0.021 g |
| ABA | 0.11 g |
| Polyfox ® PF 652 surfactant (10% in PM) | 0.031 g |
| BLO | 2.69 g |
| Dioxalane | 3.24 g |
| PM | 3.50 g |
| MEK | 3.24 g |

This coating formulation was filtered and applied to an electrochemically roughened and anodized aluminum substrate that had been subjected to a treatment using an aqueous solution of sodium phosphate and sodium fluoride by means of known methods. The resulting imageable layer coating was dried for 30 seconds at 130° C. in Glunz & Jensen "Unigraph Quartz" oven. The dry coating weight of the resulting positive-working imageable layer was about 1.5 g/m². The resulting lithographic printing plate precursor was further treated in an oven at 62° C. and 29% relative humidity for 24 hours.

Precursor 2:

Precursor 2 was prepared according to Invention Example 2 of U.S. Patent Application Publication 2009/0162783 A1 (Levanon et al.) having the positive-working imageable layer formulation shown in [0213] and containing DMABA as the developability enhancing compound. This publication is incorporated herein by reference.

INVENTION EXAMPLE 1

A sample of Precursor 1 was exposed using the Kodak® Magnus 400 Quantum imager at a range of energies, 50 mJ/cm² to 200 mJ/cm² and processed in a Mercury Mark VI processor using Developer 1 (described below) at 23° C. for 25 seconds.

| Developer 1 | |
|---|---|
| Component | Concentration (%) |
| KOH | 2.70 |
| Potassium citrate | 1.75 |
| Bayhibit ® AM | 0.50 |
| CaCl$_2$ x 2H$_2$O | 0.04 |
| DowFax ® 2Al | 0.50 |
| Hydromax 300 | 0.10 |
| Water | 94.4 |

The results obtained using fresh Developer 1 in the automatic processor are summarized in the following table.

| Corrosion Weight Loss (g/m²) | CDL (%) | Clearing Point (mJ/cm²) | Linearity Point (mJ/cm²) |
|---|---|---|---|
| 0.02 | 0.5 | 60 | 100 |

Clearing Point is the lowest imaging energy at which the exposed regions were completely removed by the developer at a given temperature and time. Linearity Point is the energy at which the 50% dots at 200 lpi screen are reproduced as 50%±0.2% dots). Cyan Density Loss (CDL %) provides a measure of the resistance of the non-exposed regions on the lithographic printing plate to the developer. CDL % is calculated using the following formula.

$$CDL\% = (OD_b - OD_a)/OD_b \times 100$$

wherein $OD_a$ is the optical density of the non-exposed coating after development and $OD_b$ is the optical density of the non-exposed coating before development. The optical densities were measured using an X-Rite 500 Series Spectrodensitometer with a cyan filter.

The corrosion weight loss data provide a measure of the resistance of the substrate under the imageable layer to the developer. It was measured on a 16 cm×16 cm square of the uncoated substrate. The weight loss was measured by comparing the initial weight of the aluminum square with the weight of the aluminum square after it had been treated in the developer for 30 seconds at 23° C., rinsed with water, and dried.

INVENTION EXAMPLE 2

Invention Example 1 was repeated except that Precursor 1 was replaced with Precursor 2. The developer soaking time was set to 20 seconds and the results are shown in the following table.

| Corrosion Weight Loss (g/m$^2$) | CDL (%) | Clearing Point (mJ/cm$^2$) | Linearity Point (mJ/cm$^2$) |
| --- | --- | --- | --- |
| 0.02 | 0.8 | 50 | 90 |

As seen from the table above, Precursor 2 when developed using Developer 1 not only exhibited good imaging characteristics in terms of CDL, clearing point, and linearity point, but it also exhibited little or no attack on the aluminum-containing substrate.

COMPARATIVE EXAMPLE 1

Invention Example 2 was repeated except development was carried out using Developer 2 from which Bayhibit® AM was omitted. The resulting developer exhibited precipitation of calcium hydroxide and the remaining mother liquor exhibited very aggressive attack on the non-exposed regions of the coating of Precursor 1 and on its aluminum-containing substrates.

INVENTION EXAMPLES 3 and 4

These examples illustrate the resistance of the aluminum-containing substrate used in Invention Example 1 (Precursor 1 without the imageable coating) to simplified developers derived from 3% KOH, 0.05% CaCl$_2$×2H$_2$O and Bayhibit® AM at 0.2% or 0.5%.

The substrate resistances to the various simplified developers were measured as follows:

A 16 cm×16 cm sample of the substrate was soaked in a test developer for 30 seconds at 23° C., rinsed with water, and dried. The optical density (OD) on the front of the substrate and the total weight of the test sample were measured before and after the treatment. The optical density was measured using an X-Rite 500 Series Spectrodensitometer. The resulting weight loss values were normalized by the weight loss value obtained by treating the test sample in a 3% KOH solution as a reference solution (0.918 g/m$^2$). The results are shown in the following table.

| Invention Examples | Chelating Agent | Weight loss (g/m$^2$) | Normalized Weight loss | Δ O.D. |
| --- | --- | --- | --- | --- |
| 3 | Bayhibit ® AM, 0.20% | 0.037 | 0.040 | −0.003 |
| 4 | Bayhibit ® AM, 0.50% | 0.023 | 0.025 | −0.002 |

As seen from these results, the developer compositions of this invention caused little or no attack on the aluminum-containing substrates used in Precursor 1.

INVENTION EXAMPLES 5-8

Invention Examples 3 and 4 were repeated except that no calcium ions were added to the 3% KOH solution and the amounts of the chelating agent Bayhibit® AM were varied. The complex formation constants were obtained from *Trends in Analytical Chemistry*, Vol. 22(10), 2003. The results are summarized as follows.

| Invention Examples | Chelating Agent (amount, weight) | Normalized Weight loss | Complex Formation Constant (log K) | |
| --- | --- | --- | --- | --- |
| | | | Ca$^{2+}$ | Al$^{3+}$ |
| 5 | Bayhibit ® AM, 0.002% | 1.0 | 4.4 | 6.7 |
| 6 | Bayhibit ® AM, 0.020% | 1.0 | 4.4 | 6.7 |
| 7 | Bayhibit ® AM, 0.200% | 1.0 | 4.4 | 6.7 |
| 8 | Bayhibit ® AM, 0.500% | 1.1 | 4.4 | 6.7 |

The results from these examples show that use of the chelating agents with the complex formation constant with Ca$^{2+}$ between 3.5 and 4.5 and the complex formation constant with Al$^{3+}$ at or below 7 had little or no effect on worsening the attack on the aluminum-containing substrate used in Invention Example 1 (Precursor 1) by the 3% potassium hydroxide solution even when the chelating agent was used in high amounts.

COMPARATIVE EXAMPLES 2-4

Invention Examples 3 and 4 were repeated except that Bayhibit®AM was replaced in the developers by each of three chelating agents outside the scope of the present invention. The complex formation constants (log K) for Ca$^{+2}$ cation were 3.5 or lower with each of the chelating agents acrylic acid (Comparative Example 2, 0.069 mole/liter, 0.5 weight %), citric acid (Comparative Example 3, 0.026 mole/liter, 0.5 weight %), and succinic acid (Comparative Example 4, 0.042 mole/liter, 0.5 weight %). All three solutions were stable when "fresh" but showed precipitation of calcium salts with time. Thus, these developer compositions did not have adequate shelf stability.

COMPARATIVE EXAMPLES 5-16

Invention Examples 5-8 were repeated except that Bayhibit® AM was replaced in the developers by various chelating agents outside the scope of the present invention. The calcium and aluminum complex formation constants were obtained from *Trends in Analytical Chemistry*, Vol. 22(10), 2003. The results are summarized in the following table.

| Comparative Examples | Chelating Agent (amount, weight) | Normalized Weight loss | Complex Formation Constant (log K) | |
| --- | --- | --- | --- | --- |
| | | | Ca$^{2+}$ | Al$^{3+}$ |
| 5 | EDDS, 0.002% | 1.1 | 4.7 | 12.9 |
| 6 | EDDS, 0.020% | 1.3 | | |
| 7 | EDDS, 0.200% | 1.7 | | |
| 8 | NTA, 0.002% | 1.3 | 6.4 | 11.4 |
| 9 | NTA, 0.020% | 1.7 | | |
| 10 | NTA, 0.200% | 2.7 | | |
| 11 | EDTA, 0.002% | 2.7 | 10.6 | 16.5 |
| 12 | EDTA, 0.020% | 2.9 | | |
| 13 | EDTA, 0.200% | 3.2 | | |
| 14 | DTPA, 0.002% | 1.5 | 10.8 | 18.7 |
| 15 | DTPA, 0.020% | 2.7 | | |
| 16 | DTPA, 0.200% | 3.1 | | |

The results of these comparative examples show that using the chelating agents outside the scope of the present invention in the developer composition drastically increased the attack of the developer compositions on the aluminum-containing substrate used in the lithographic printing plate Precursor 1. The normalized weight loss values for these developers were greater than 1, indicating that they are more aggressive against the substrate than a 3% KOH solution.

INVENTION EXAMPLES 9 and 10

Invention Example 4 was repeated except that $CaCl_2 \times 2H_2O$ was replaced with alternative $M^{2+}$ cation containing salts having cation concentrations corresponding to 0.00272 gram-atoms/kg of solution as in Invention Example 4. The results are listed in the following table.

| Invention Example | $M^{+2}$ Salt | Weight Loss (g/m$^2$) | Normalized Weight Loss |
|---|---|---|---|
| 9 | $ZnCl_2$ | 0.454 | 0.49 |
| 10 | $SrCl_2$ | 0.028 | 0.03 |

These results show that $Zn^{2+}$ and $Sr^{2+}$ cations were also effective to protect the aluminum-containing substrate used in Invention Example 1 (Precursor 1), although $Zn^{2+}$ cations are the least effective of the $Zn^{2+}$, $Sr^{2+}$, and $Ca^{2+}$ cations.

Invention Example 11

Invention Example 9 was repeated with the amount of $Zn^{2+}$ cations in the developer composition increased by a factor of 10 (10×) corresponding to 0.0272 gram-atoms/kg of solution. The results are summarized in the following table.

| Invention Example | $M^{2+}$ Salt | Weight Loss (g/m$^2$) | Normalized Weight Loss |
|---|---|---|---|
| 11 | Bayhibit ® AM $ZnCl_2$ 10× | 0.022 | 0.024 |

These results show that the $Zn^{2+}$ cations are more effective in protecting the aluminum-containing substrate when used in higher concentrations.

COMPARATIVE EXAMPLES 17-21

Invention Example 4 was repeated except that $CaCl_2 \times 2H_2O$ was replaced with metal cations outside the scope of the present invention in amounts (1×) of metal cations corresponding to 0.00272 gram-atoms/kg of solution as in Invention Example 4 or in amounts increased by a factor of 10 (10×). The results are listed in the following table.

| Comparative Examples | Metal Salt (amount) | Weight Loss (g/m$^2$) | Normalized Weight Loss |
|---|---|---|---|
| 17 | $SnCl_2$, 1× | 0.909 | 0.99 |
| 18 | $MgCl_2$, 1× | 0.981 | 1.07 |
| 19 | $SnCl_2$, 10× | 0.805 | 0.877 |
| 20 | $MgCl_2$, 10× | 0.900 | 0.980 |
| 21 | LiCl, 10× | 0.416 | 0.453 |

These results show that the use of $Sn^{2+}$, $Mg^{2+}$, and $Li+$ cations in the developer composition was not effective in protecting the aluminum-containing substrate used in Invention Example 1 (Precursor 1), even when the amounts were increased by a factor of 10×.

The invention has been described in detail with particular reference to certain preferred embodiments thereof, but it will be understood that variations and modifications can be effected within the spirit and scope of the invention.

The invention claimed is:

1. A method for providing a lithographic printing plate comprising:

A) imagewise exposing a positive-working lithographic printing plate precursor having a grained aluminum-containing and sulfuric acid or phosphoric acid anodized substrate comprising an anodic oxide film and having an imageable layer comprising an infrared radiation absorbing compound thereon, to infrared radiation to provide exposed and non-exposed regions in the imageable layer, and B) processing the exposed lithographic printing plate precursor with a silicate-free alkaline aqueous developer composition to remove the exposed regions in the imageable layer, wherein the silicate-free alkaline aqueous developer composition has a pH of at least 12, and comprises:

a metal cation $M^{2+}$ selected from barium, calcium, strontium, and zinc cations, and a chelating agent that has a complex formation constant (log K) for the metal cation of at least 3.5 and less than or equal to 4.5, and a log K for aluminum ion that is 7 or less.

2. The method of claim 1 wherein the positive-working lithographic printing plate precursor has a single imageable layer disposed on the substrate.

3. The method of claim 1 wherein the imageable layer comprises a polymeric binder comprising recurring units represented by either or both of the following Structures (Ia) and (Ib), in random order:

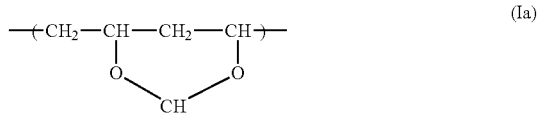

(Ia)

(Ib)

wherein:
when both the Structure (Ia) and (Ib) recurring units are present, the Structure (Ia) recurring units are present in an amount of at least 10 and up to and including 35 mol %, and the Structure (Ib) recurring units are present in an amount of at least 25 and up to and including 60 mol %, all based on total recurring units in the polymeric binder, R is a substituted or unsubstituted hydroxyaryl group, and $R_2$ is a substituted or unsubstituted hydroxyaryl group in which the hydroxyl group is ortho to the ester linkage.

4. The method of claim 1 wherein the positive-working lithographic printing plate precursor has a surface imageable layer containing hydroxymandelic acid, an organic compound having at least one amino group and at least one carboxylic acid group directly linked to an aryl group, or both hydroxymandelic acid and at least one of the organic compounds.

5. The method of claim 1 wherein the developer composition has a pH of at least 12 and up to and including 13.5, and comprises a hydroxide, an alkali metal salt other than the chelating agent, $M^{2+}$ that is calcium metal cation, and a chelating agent has a complex formation constant (log K) for the calcium metal cation of at least 3.5 and less than or equal to 4.5, and a log K for aluminum ion that is less than or equal to 7.

6. The method of claim 5 wherein the chelating agent is 2-phosphonobutane-1,2,4-tricarboxylic acid.

7. The method of claim 1, wherein the developer composition has a pH of at least 12 and up to and including 13.5, and comprises a hydroxide, citrate, $M^{2+}$ that is calcium metal cation, and a chelating agent that is 2-phosphonobutane-1,2,4-tricarboxylic acid.

8. The method of claim 1 wherein the developer composition comprises a cationic surfactant, and optionally an anionic surfactant.

9. The method of claim 1 that is carried out in a processing apparatus to which the developer composition is supplied as a concentrate that is diluted at least 1.5 times for use in step B with water or an aqueous alkaline solution.

10. The method of claim 1 wherein the positive-working lithographic printing plate precursor comprises a grained and anodized aluminum support that has been treated with a solution of a $NaH_2PO_4$ and sodium fluoride.

11. The method of claim 1, wherein the developer composition comprises a chelating agent having a log K for calcium of from 3.5 to 4.5 and a log K for aluminum ion that is less than 7.

12. The method of claim 1, wherein the developer composition has a pH of at least 12 and up to and including 13.5.

13. The method of claim 1, wherein the developer composition further comprises an alkali metal salt that is at least one of a citrate, acetate, tartrate, nitrate, and oxalate.

14. The method of claim 1, wherein the developer composition comprises the metal cation $M^{2+}$ in an amount of at least 0.001 and up to and including 0.01 gram-atom/kg.

15. The method of claim 1, wherein the developer composition comprises the chelating agent in an amount of at least 0.01 and up to and including 0.1 mol/liter.

16. The method of claim 1, wherein the developer composition comprises either or both of an anionic surfactant and a cationic surfactant.

17. The method of claim 1, wherein the developer composition has a pH of at least 12 and up to and including 13.5, and further comprises an alkali agent that is a hydroxide and an alkali metal salt other than the chelating agent.

18. The method of claim 17, wherein the developer composition comprises 2-phosphonobutane-1,2,4-tricarboxylic acid as the chelating agent.

* * * * *